United States Patent
Grimm et al.

(10) Patent No.: US 11,280,828 B2
(45) Date of Patent: Mar. 22, 2022

(54) METHOD FOR TESTING A SYSTEM FOR A REQUIREMENT

(71) Applicant: Robert Bosch GmbH, Stuttgart (DE)

(72) Inventors: Andreas Grimm, Tiefenbronn-Muehlhausen (DE); Julian Ophey, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 11 days.

(21) Appl. No.: 16/933,399

(22) Filed: Jul. 20, 2020

(65) Prior Publication Data
US 2021/0055346 A1 Feb. 25, 2021

(30) Foreign Application Priority Data
Aug. 21, 2019 (DE) .......................... 102019212458.5

(51) Int. Cl.
*G01R 31/317* (2006.01)
*G05B 19/048* (2006.01)

(52) U.S. Cl.
CPC ..... *G01R 31/31718* (2013.01); *G05B 19/048* (2013.01); *G05B 2219/32039* (2013.01)

(58) Field of Classification Search
CPC ............ G01R 31/31718; G05B 19/048; G05B 2219/32039
See application file for complete search history.

(56) References Cited

FOREIGN PATENT DOCUMENTS

DE 202018106888 U1 12/2018

OTHER PUBLICATIONS

Abdessalem, et al., "Testing Autonomous Cars for Feature Interaction Failures using Many-Objective Search", 2018 33rd IEEE/ACM International Conference on Automated Software Engineering (ASE), ACM 3-7, Sep. 2018, pp. 143-154, XP033720331.*
Ulewicz et al., "A Priori Test Coverage Estimation for Automated Production Systems: Using Generated Behavior Models for Coverage Calculation", Sep. 12-15, 2017, 2017 22nd IEEE International Conference on Emerging Technologies and FAcotry Automation, pp. 1-4.*

(Continued)

*Primary Examiner* — Manuel L Barbee
(74) *Attorney, Agent, or Firm* — Norton Rose Fulbright US LLP; Gerard Messina

(57) ABSTRACT

A computer-implemented method for testing a system for at least one requirement. The method includes: the requirement is received in machine-readable form, at least one first input variable is ascertained for the test of the system for the received requirement, a design of the system is simulated as a function of the ascertained first input variable, an output variable of the simulated system is ascertained and it is ascertained as a function of the output variable whether the system meets the requirement, it is checked whether the simulation meets a quality requirement, if the simulation meets the quality requirement and the system meets the requirement, it is checked whether a sufficient test coverage is reached for the requirement, if the sufficient test coverage for the requirement is reached, the test for the requirement is completed.

17 Claims, 1 Drawing Sheet

(56) References Cited

OTHER PUBLICATIONS

Abdessalem, et al.: "Testing Autonomous Cars for Feature Interaction Failures using Many-Objective Search", 2018 33rd IEEE/ACM International Conference on Automated Software Engineering (ASE), ACM, Sep. 3-7, 2018, Seiten pp. 143-154, XP033720331.
Kutluay and Winner: "Validation of vehicle dynamics simulation models—a review", Vehicle System Dynamics: International Journal of Vehicle Mechanics and Mobility, 52(2), (2014), pp. 186-200, XP055752504.
Turlea, Ana: "Search based Model in the Loop Testing for Cyber Physical Systems", 2018 IEEE 16th International Conference on Embedded and Ubiquitous Computing (EUC), IEEE, (2018), pp. 22-28, XP033478545.

* cited by examiner

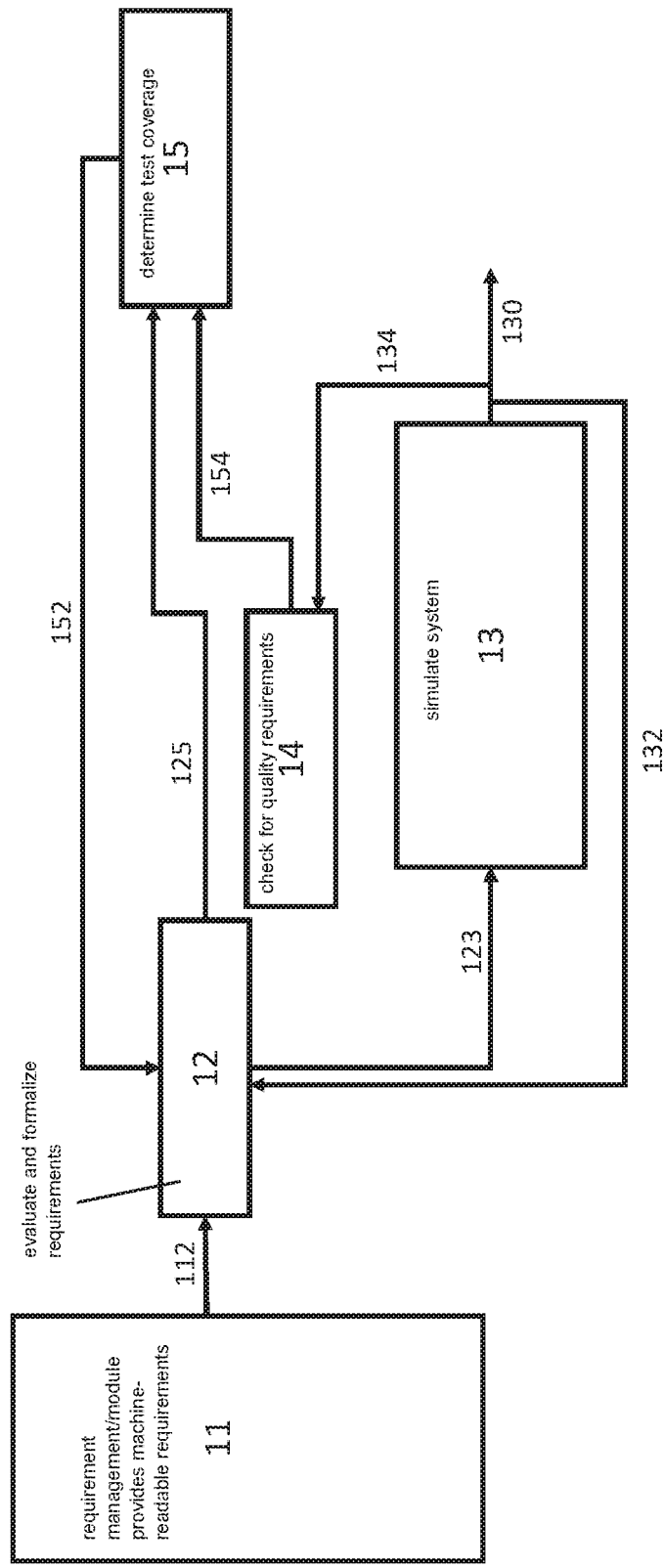

METHOD FOR TESTING A SYSTEM FOR A REQUIREMENT

CROSS REFERENCE

The present application claims the benefit under 35 U.S.C. § 119 of German Patent Application No. DE 102019212458.5 filed on Aug. 21, 2019, which is expressly incorporated herein by reference in its entirety.

FIELD

The present invention relates to computer-implemented methods for testing a system for a requirement, a computer program configured for this purpose, and a test system configured for this purpose.

BACKGROUND INFORMATION

The validation cycle for products is an important component of development. It is checked whether the desired quality requirements are achieved in real operation. To avoid safety risks beforehand, as many scenarios as possible are to be tested beforehand. These tests are linked to a high expenditure of time and resources, however. Since the complexity of technical systems is increasing continuously and the product cycles are becoming shorter, and new functions and supplements of products are also deliverable in software, it is foreseeable that the number of required tests will rise drastically. To reduce the complex validation on a real system in its planned application environment, the validation cycle may be assisted with the aid of reliable simulations in software. Both the costs and the required test time and thus the time to market may thus be significantly reduced. Moreover, above all the safety requirements on products may also be checked more reliably and efficiently in computer-implemented test methods.

A method is described in German Patent Application No. DE 20 2018 106888, using which a test coverage for a simulative test of a system is computed with respect to certain requirements, and using which the test is continued or ended as a function of the test coverage.

A method for selecting tests for testing a system is described in German Patent Application No. DE 10 2019 209538.

German Patent Application No. DE 10 2019 209539 describes methods for describing requirements for a simulation which are characterized by quality attributes.

SUMMARY

In accordance with an example embodiment of the present invention, a computer-implemented method for testing a system for at least one requirement is provided.

The system includes in particular a computer program, a piece of hardware, or an embedded system. The example method may particularly advantageously be used if the tested system is a subsystem of an at least semi-autonomous vehicle or an at least semi-autonomous robot, or the tested system is an at least semi-autonomous vehicle or an at least semi-autonomous robot.

The requirement includes in particular a functional or performance-related requirement or a requirement for the functional safety of the system in its (actual) design.

In the example method in accordance with the present invention, the requirement is received in machine-readable form. For the test of the system for the received requirement, at least one first input variable is ascertained and a design of the system is simulated as a function of the ascertained first input variable.

Furthermore, an output variable of the simulated system is ascertained and it is ascertained depending on the output variable whether the system meets the requirement.

Furthermore, it is checked whether the simulation meets a quality requirement. The check includes in particular a check as to whether the simulation departs from a permissible parameter range or violates predetermined boundary conditions or whether models or sub-models required for the simulation are available.

If the simulation meets the quality requirement and the system meets the requirement, it is checked in the provided method whether a sufficient test coverage is achieved for the requirement. If the sufficient test coverage is achieved for the requirement, the test is completed for the requirement.

A particularly reliable and efficient automated test method for simulative tests of systems is thus provided. A test end may be determined reliably only depending on permissible simulations by a permanent automatically running check of the simulations used for quality requirements and by the corresponding consideration of the check for the update of the test coverage. The validity of the test method is continuously checked. Automatic test generation, evaluation of the quality of the test system, and determination of a test end condition are linked to one another, so that an automated test sequence may be implemented efficiently on a virtual platform.

In one preferred embodiment of the present invention, the method is continued for a next requirement until all available requirements have been processed. The automation of the test method is also enabled over a requirement or a requirement set, which further increases the efficiency of the test method.

If the test coverage is not reached, preferably at least one further input variable is ascertained depending on the requirement and the system is simulated for the at least one further input variable. In particular, further simulations may be carried out for further input variables ascertained depending on the requirement and accordingly further output variables may be checked by the test system until the test coverage is achieved for the requirement. The method is thus automatically continued until a test end is automatically established. The simulation is advantageously not taken into consideration for a computation of the test coverage if the simulation does not meet the quality requirement.

In one preferred embodiment of the present invention, the further input variable is ascertained as a function of a robustness value, which describes how well the system meets the requirement for the first input variable. The robustness value is ascertained in particular as a function of an output variable of the simulated system. The test case generation may thus be implemented particularly efficiently, for example, using optimization methods such as search-based testing.

In a further preferred embodiment of the present invention, in the event of a violation of the requirement in the simulation, an error is established for the first input variable and the error is stored and/or output. The error storage and/or the error output may include in particular a piece of information about the violated requirement and about the first input variable. The error output or error storage preferably includes a piece of information about an extent of the violation of the requirement. In one particularly preferred variant, an automatic correction of the system takes place as a function of the established error. The freedom from errors and safety of the tested system may thus be ensured or maintained automatically on the basis of the tests.

Specific embodiments of the present invention are explained in greater detail hereinafter with reference to the FIGURE.

BRIEF DESCRIPTION OF THE DRAWING

FIG. 1 schematically shows an exemplary test system in accordance with the present invention.

DETAILED DESCRIPTION OF EXAMPLE EMBODIMENTS

For complex systems, for example, electronic systems, embedded systems, or hydraulic or mechatronic systems, a complete check for requirements on the system is often difficult to implement in its design, due to safety requirements on the systems, however, sufficient test coverage is desirable. In particular, for semi-autonomous systems such as vehicles or robots, reliable and efficient tests for safety requirements are particularly significant. Due to reduced human correction options in the actual design of the system and the drastic effects of system errors, particularly high safety requirements apply. At the same time, such systems are extremely flexible and complex and the scenarios and surrounding conditions possible for them are barely comprehensible. The safety of such systems for users and surroundings is also already to be ensured in the development. FIG. 1 schematically shows an exemplary test environment or an exemplary test system for testing a system. Machine-readable requirements may be provided by a requirement management 11, for which the system to be tested is to be tested. In a block 12, received requirements may be evaluated and formalized and for these test cases, corresponding input variables are ascertained or generated. In a block 13, a simulation of the system is carried out for the ascertained or generated input variables. In a block 14, as a function of an output variable of the simulation, it may be checked for quality requirements. In a block 15, a test coverage may be determined for the present test with respect to the requirement tested thereby. In block 12, a continuation or a termination of the test for this requirement may be determined as a function of the test coverage. Moreover, in block 12, a robustness measure may be determined or taken into consideration, which describes how well the requirement was met by the system. As a function of the requirement and possibly the robustness measure, further input variables for further simulations may be generated in block 12 in the case of a continued test.

Corresponding test methods will be described on the basis of the example of a test of a semi-autonomous vehicle in particular, which prompts autonomous emergency brake applications within the scope of a vehicle movement control.

For studies within the scope of simulative tests on a system, output variables are a focal point, which are of particular relevance for the observed system, in particular for a certain requirement on the system. More complex systems typically have multiple relevant output variables.

In the example of the emergency braking function, these may be, for example, yaw rate, longitudinal velocity, or longitudinal acceleration of the vehicle.

The basis for the tests are requirements from the requirement management or requirement module 11, which provides, for example, legal requirements, requirements from the specification of the system, or requirements for a functional safety of the system in machine-readable form.

The requirements are then transmitted in a step 112 to a block or to a module 12. An assessment and formalization of the received requirements may take place therein to assist automated and quantitative test generation. The formalization may include, for example, a translation of machine-readable text requirements into equations, formulas, or functions, in particular for time-variant requirements. Requirements are preferably formalized in such a way that a quantitative evaluation of a requirement fulfillment and possibly also a degree of fulfillment is made possible. The requirements may also include boundary conditions on the system or the system design. Various requirements may also be combined for the further steps.

For the example of the emergency braking function, for example, a requirement may be received that a maximum deceleration may not be exceeded during a longitudinal deceleration. As a boundary condition, in addition a requirement for the test may be included, that the test is to meet for a certain input variable range or parameter range of friction coefficients and a certain input variable range or parameter range of road gradients. These requirements may be evaluated and formalized and possibly combined to form a request.

Subsequently, in block 12, an automated test case generation is carried out within a defined parameter space predetermined by the requirement. Optimization methods such as search-based testing may preferably be used for the test case generation. In particular, targeted input variables or parameters for the simulation models are ascertained or generated, for which a violation of the requirement is expected with increased probability. The quality of the test case generation and the efficiency of the test method as a whole may be significantly increased by the use of optimization methods such as search-based testing.

Block 13 receives the generated input variables or simulation parameters in step 123 and simulates the system to be tested as a function thereof. In the simulation, the system is designed on the basis of a system model, which includes in particular a route model. The tested system is checked for the formalized requirement on the basis of the simulation.

It may be ascertained whether the requirement is met in block 12 on the basis of an output variable of the simulation received in step 132 from block 13. In addition, a measure of how well or poorly the system meets or does not meet the requirement (robustness measure) may also be determined on the basis of the output variable. A new input variable for a further simulation may be generated or ascertained in block 12 as a function of the output variable 132 and possibly as a function of the robustness measure.

In the test case generation, tests may also be generated in which the test system or the test environment or the simulation is operated in a non-valid range. For example, a model used may not depict the required dynamics. A corresponding check of the simulation for such quality requirements and a corresponding evaluation as to whether or how the quality requirement is met may be carried out in block 14 on the basis of an output variable, which block 14 receives from block 13 in step 134. Algorithms are stored for this purpose in block 14 for a quantitative evaluation of a quality of the simulation environment or simulation models used. The resilience of the corresponding tests is significantly increased by the corresponding evaluation on the basis of objectified, quantitative quality requirements. The tests are thus more reliable and informative, for example, also as a decision basis for the improvement, refinement, and product release of a system in development.

Block 14 may output a variable in step 154, which includes whether and possibly how a quality requirement on the simulation is met thereby.

In block 15, a measure for the test coverage with respect to a certain requirement or a set of requirements may be ascertained for the test method. Such a test coverage measure is preferably determined as a function of the probability at which the system violates the requirement, in particular for the input variables or parameter space which have not yet been tested.

The ascertainment is preferably carried out as a function of the pieces of information received from block 12 in step 125 as to whether and possibly how the tested system in the simulation meets the tested requirement for the tested input variable. A consideration of the simulation for the ascertained test coverage measure may preferably be carried out as a function of the variable received from block 14 in step 154, which includes whether and possibly how a quality requirement on the simulation is met thereby.

If the test coverage measure results in sufficient coverage, in particular by comparison to a predetermined test coverage or to a predetermined residual probability for errors, the test may be completed for the presently tested requirement or the presently tested set of requirements. Otherwise, further tests may be carried out on the system for the requirement using further input variables or simulation parameters from block 12. The corresponding information about completion or continuation of the test may be transmitted from block 15 to block 12 in step 152.

Block 15 thus in particular receives the test result and the information as to whether the test platform was operated in a valid range and ascertains therefrom whether the requirement was already sufficient. The following input conditions and consequences may occur, for example:

1) Requirement met by the system and quality requirement on the test environment met. The test result is taken into consideration for the test coverage.
2) Requirement met by the system but quality requirement on the test environment not met. The test result is not taken into consideration for the test coverage.
3) Requirement not met by the system, quality requirement on the test environment met. The test result is taken into consideration for the test coverage.
4) Requirement not met by the system and quality requirement for the test environment not met. The test result is not taken into consideration for the test coverage.

In the example of the emergency braking function, for example, a test coverage of greater than 99% is required, for example, corresponding to a residual probability for the occurrence of an error in the remaining input variable space or parameter space of less than 1%.

For a first test case, a first friction coefficient and a first gradient value are generated as input variables within the permissible parameter ranges for each of them and the system is simulated for them. The simulation may take place, for example, as a design of the system for a certain parameter range on longitudinal velocities. The longitudinal deceleration of the vehicle occurring in the simulation is observed and evaluated as the output variable of the simulation, for example. If it meets the tested requirement, if it is thus less than the permissible maximum deceleration, and if the simulation meets the quality requirement directed to it, the test coverage thus increases. If a check has the result that the required test coverage is not yet reached, a new test is thus initiated or a new test case is generated.

For this second test case, a pair of input variables which have not yet been tested are ascertained for friction coefficient and road gradient, again within the parameter ranges permissible for each of them. The system is again simulated for these input variables. The simulation may also again be produced, for example, as an embodiment of the system for a certain parameter range on longitudinal velocities. The longitudinal deceleration of the vehicle occurring in the simulation may again be observed and evaluated as output variable of the simulation, for example. If it meets the tested requirement, if it is thus less than the permissible maximum deceleration, but the simulation does not meet the quality requirement directed to it, the simulation is thus not taken into consideration for the test coverage. For example, a regulation of the deceleration may be carried out by an ABS intervention, but the simulation or the model used for the simulation does not include an adequate tire model for such an ABS intervention under the given boundary conditions and for the tested input variables. Since the test coverage was thus not increased by the simulation, a new test is initiated or a new test case is generated.

For this third test case, a pair of input variables which have not yet been tested are ascertained for friction coefficient and road gradient, again within the parameter ranges permissible for each of them. The system is again simulated for these input variables. The simulation may also again take place, for example, as a design of the system for a certain parameter range on longitudinal velocities. The longitudinal deceleration of the vehicle occurring in the simulation may again be observed and evaluated as the output variable of the simulation, for example. If it does not meet the tested requirement, if it is thus greater than the permissible maximum deceleration, the corresponding error may thus be stored or output, an automatic error correction may be carried out, and the test may also be terminated due to the occurring error. Alternatively to an abortion due to the occurring error, the simulation may be used for an update of the test coverage if the simulation meets the quality requirement directed to it. If a check has the result that the required test coverage is not yet reached, a new test is thus initiated or a new test cases generated.

For this fourth test case, a pair of input variables which have not yet been tested are ascertained for friction coefficient and road gradient, again within the parameter ranges permissible for each of them. The system is again simulated for these input variables. The simulation may also again take place, for example, as a design of the system for a certain parameter range on longitudinal velocities. The longitudinal deceleration of the vehicle occurring in the simulation may again be observed and evaluated as the output variable of the simulation, for example. If the longitudinal deceleration meets the tested requirement it is thus less than the permissible maximum deceleration, the simulation meets the quality requirement directed to it; the simulation may thus be taken into consideration for an update of the test coverage. If a check has the result that the required test coverage of 99% is now reached, the test is thus completed for this tested requirement.

What is claimed is:

1. A computer-implemented method for testing a system for at least one requirement, comprising the following steps:
   receiving the requirement in machine-readable form;
   ascertaining at least one first input variable for the test of the system for the received requirement;
   simulating a design of the system as a function of the ascertained first input variable;
   ascertaining an output variable of the simulated system and ascertaining, as a function of the output variable, whether the system meets the requirement;

checking whether the simulation meets a quality requirement;

based on the simulation meeting the quality requirement and the system meeting the requirement, checking whether a sufficient test coverage is reached for the requirement; and based on reaching the sufficient test coverage for the requirement, the testing for the requirement is completed, wherein based on the test coverage not being reached, at least one further input variable is ascertained as a function of the requirement and the system is simulated for the at least one further input variable.

2. The method as recited in claim 1, wherein the method is repeated for a next requirement until all available requirements have been processed.

3. The method as recited in claim 1, wherein the further input variable is ascertained as a function of a robustness value, which describes how well the system meets the requirement for the first input variable.

4. The method as recited in claim 3, wherein the robustness value is ascertained as a function of an output variable of the simulated system.

5. The method as recited in claim 1, wherein further simulations take place for further input variables ascertained as a function of the requirement and corresponding further output variables are checked by the test system until the test coverage for the requirement is reached.

6. The method as recited in claim 1, wherein based on the simulation not meeting the quality requirement, the simulation is not taken into consideration for a computation of the test coverage.

7. The method as recited in claim 6, wherein the quality requirement includes a check as to whether the simulation departs from a permissible parameter range or violates predetermined boundary conditions or whether models or sub-models necessary for the simulation are available.

8. The method as recited in claim 1, wherein the tested system includes a computer program, or a piece of hardware, or an embedded system.

9. The method as recited in claim 1, wherein the tested system is a subsystem of an at least semi-autonomous vehicle or an at least semi-autonomous robot, or the tested system is an at least semi-autonomous vehicle or an at least semi-autonomous robot.

10. The method as recited in claim 1, wherein the requirement includes a requirement for functional safety of the system.

11. The method as recited claim 1, wherein when the requirement is violated in the simulation for the first input variable, an error is established, and the error is stored and/or the error is output.

12. The method as recited in claim 11, wherein the error storage and/or the error output includes a piece of information about the violated requirement and about the first input variable.

13. The method as recited in claim 12, wherein the error output or error storage includes a piece of information about an extent of the violation of the requirement.

14. The method as recited in claim 11, wherein an automatic correction of the system takes place as a function of the established error.

15. A non-transitory machine-readable memory on which is stored a computer program for testing a system for at least one requirement, the computer program, when executed by a computer, causing the computer to perform the following steps:

receiving the requirement in machine-readable form;

ascertaining at least one first input variable for the test of the system for the received requirement;

simulating a design of the system as a function of the ascertained first input variable;

ascertaining an output variable of the simulated system and ascertaining, as a function of the output variable, whether the system meets the requirement;

checking whether the simulation meets a quality requirement;

based on the simulation meeting the quality requirement and the system meeting the requirement, checking whether a sufficient test coverage is reached for the requirement; and based on reaching the sufficient test coverage for the requirement, the testing for the requirement is completed, wherein based on the test coverage not being reached, at least one further input variable is ascertained as a function of the requirement and the system is simulated for the at least one further input variable.

16. A test system for testing a system for at least one requirement, the system configured to:

receive the requirement in machine-readable form;

ascertain at least one first input variable for the test of the system for the received requirement;

simulate a design of the system as a function of the ascertained first input variable;

ascertain an output variable of the simulated system and ascertaining, as a function of the output variable, whether the system meets the requirement;

check whether the simulation meets a quality requirement;

based on the simulation meeting the quality requirement and the system meeting the requirement, check whether a sufficient test coverage is reached for the requirement; and based on reaching the sufficient test coverage for the requirement, the testing for the requirement is completed, wherein based on the test coverage not being reached, at least one further input variable is ascertained as a function of the requirement and the system is simulated for the at least one further input variable.

17. The test system as recited in claim 16, including a memory and a processor.

* * * * *